(12) United States Patent
Wildenberg et al.

(10) Patent No.: US 6,295,595 B1
(45) Date of Patent: Sep. 25, 2001

(54) METHOD AND STRUCTURE FOR ACCESSING A REDUCED ADDRESS SPACE OF A DEFECTIVE MEMORY

(75) Inventors: Eli Wildenberg; Gennady Goltman, both of Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/295,934

(22) Filed: Apr. 21, 1999

(51) Int. Cl.$^7$ ........................................ G06F 11/20
(52) U.S. Cl. ..................... 711/211; 711/170; 711/173; 714/8; 714/702; 365/230.06; 365/230.02
(58) Field of Search ..................... 711/211, 202, 711/2, 1, 170, 172, 173, 212, 154, 103; 714/710, 702, 8; 365/230.02, 230.06

(56) References Cited

U.S. PATENT DOCUMENTS

| | | |
|---|---|---|
| 4,366,555 | 12/1982 | Hu . |
| 5,199,001 | 3/1993 | Tzeng . |
| 5,768,192 | 6/1998 | Eitan . |
| 6,006,313 | * 12/1999 | Fukumoto ........................ 711/211 |

* cited by examiner

*Primary Examiner*—Do Hyun Yoo
*Assistant Examiner*—Yamir Encarnacion
(74) *Attorney, Agent, or Firm*—Bever, Hoffman & Harms, LLP; Edward S. Mao

(57) ABSTRACT

A circuit and method for producing defect tolerant high density memory cells at a low cost is disclosed. Rather than using redundant memory cells to salvage a memory circuit having non-functional memory cells, an address mapping circuit is used to remap addresses for non-functional memory cells into addresses for functional memory cells. Specifically, if the memory array of a memory circuit includes non-functional memory cells, an address mapping scheme is selected to reduce the effective size of the memory circuit so only functional memory cells are addressed. Because redundant memory cells are not included in the memory circuit, the semiconductor area and the cost of the memory circuit is reduced.

14 Claims, 14 Drawing Sheets

METHOD AND STRUCTURE FOR ACCESSING A REDUCED ADDRESS SPACE OF A DEFECTIVE MEMORY

FIELD OF THE INVENTION

The present invention relates memory circuits. More specifically, the present invention relates to a method and structure to use a memory array having defective memory cells.

RELATED ART

FIG. 1 is block diagram of a conventional memory circuit 100. Memory circuit 100 comprises a memory array 110, an address decoder 120, and a data tranceiver 130. Typically, memory circuit 110 is accessed by an address bus ADDR coupled to address decoder 120 and a data bus DATA coupled to data tranceiver 130. Some embodiments of data tranceiver 130 may be implemented using separate data receiving circuits and driving circuits. Address bus ADDR comprises N address lines, referred to as A[N−1], A[−2], ..., A[0], where A[N−1] is the most significant bit of address bus ADDR. To avoid confusion, the individual bits of an address on address bus ADDR are also referred to by A[N−1], ..., A[0], where A[N−1] is the most significant bit. A range of address lines (or address bits) A[s], A[s−1], ..., A[t] is denoted as address lines (or address bits) A[s:t].

Typically, to read a data word from memory array 110, the address of the desired data word is driven onto address bus ADDR. Address decoder 120 decodes the address to enable the appropriate word lines (not shown) of memory array 110. Then memory array 110 drives the requested data word to data tranceiver 130. Typically, memory array 110 drives very low voltage signals to data tranceiver 130. Therefore, data tranceiver 130 converts the voltage levels of the data word received from memory array 110 to the voltage levels of data bus DATA and drives the requested data word onto data bus DATA. To write a data word into memory array 110, an address is driven onto address bus ADDR and a data word is driven onto data bus DATA. Address decoder 120 decodes the address to enable the appropriate word lines of memory array 110. Data tranceiver 130 converts the data word on data bus DATA to the voltage levels necessary to program memory array 110.

To be competitive in the marketplace, memory circuits must have very high density, i.e., must have large memory arrays, and must be produced at very low cost. One major factor in the cost of producing a memory circuit is the defect rate of the memory circuit. The defect rate is typically expressed as the number of memory circuits that are defective out of a fixed number (typically 1000) of memory circuits produced. For example, if for every 1000 instances of memory circuit 100, 50 instances are defective, memory circuit 110 has a defect rate of 50/1000. In general, large memory circuits have higher defect rates because large memory arrays are difficult to manufacture.

A single defective memory cell in memory array 110 renders memory circuit 100 defective. A common approach to lessen the severity of non-functional memory cells is to include redundant memory cells which can replace non-functional memory cells. FIG. 2 is a block diagram of a conventional memory circuit 200 using redundant memory cells. Specifically, memory circuit 200 includes an address decoder 220, a memory array 110, a redundant memory array 210, and a data tranceiver 230. If memory array 110 does not contain any non-functional memory cells, memory circuit 200 behaves the same as memory circuit 100 with redundant memory array 210 being unused. However, if memory array 110 contains non-functional memory cells, address decoder 220 and data tranceiver 230 are configured to salvage memory circuit 200 by using memory cells from redundant memory array 210 in place of the non-functional memory cells of memory array 110.

Typically, memory array 110 is divided into rows, columns, and/or blocks of memory cells. Similarly redundant memory array 210 is divided into rows, columns, and/or blocks of memory cells. For clarity, the term "partition" is used herein to refer to any group of memory cells including rows and columns of memory cells.

Typically, each partition in redundant memory array 210 is associated with a set of partitions in memory array 110. If one of the partitions of memory array 110 contains non-functional memory cells (i.e., a non-functional partition), address decoder 220 and data tranceiver 230 are configured to use the associated partition in redundant memory array 210 in place of the non-functional partition of memory array 110. Specifically, if address decoder 220 receives an address on address bus ADDR referencing the non-functional partition, address decoder enables the associated partition of redundant memory array 210 instead of the non-functional partition. On reads, data tranceiver 230 drives the data from the associated partition of redundant memory array 210 onto data bus DATA. On writes, data tranceiver 230 drives the data from data bus DATA to the associated partition in redundant memory array 210. Thus, instances of memory circuit 200 which contain non-functional memory cells can be salvaged rather than discarded.

Typically, address decoder 220 and data tranceiver 230 contain non-volatile memory (not shown), such as FLASH memory cells, fuses, or anti-fuses, for storing redundancy configuration data. Before packaging, memory array 110 is tested for non-functional partitions, if a non-functional partition is discovered, address decoder 220 and data tranceiver 230 are configured to use the associated partition of redundant memory array 210. Thus, by storing redundancy configuration data in non-volatile memory on memory circuit 200, the use of redundant memory is transparent to end users.

If too many non-functional partitions of memory array 110 are associated with the same partition of redundant memory array 210, memory circuit 200 can not replace all of the non-functional partitions. In this instance, memory circuit 200 is defective and must be discarded. To overcome this problem, many conventional methods to further reduce the defect rate of memory circuit 200 have been developed. For example, one method is to increase the size of redundant memory array 210 so that multiple partitions in redundant memory array 210 can be associated with each set of partitions in memory array 110. A second method is to increase the number sets of partitions in memory array 110 and increasing the number of partitions in redundant memory array 210 while reducing the size of each set of partitions in memory array 110 , so that each partition of redundant memory array 210 is associated with a smaller number of partitions in memory array 110. Most of these methods involve increasing the size of redundant memory array 210 to provide more redundancy for memory array 110. However, one problem with increasing the size of redundant memory array 210 is the increased possibility that redundant memory array 210 may also contain non-functional memory cells. Thus, the decrease in defect rate produced by using these methods is partially offset by the possibility of non-functional partitions in redundant array 210.

Another problem with using redundant memory arrays in memory circuits is the effect of a redundant memory array on the cost of the memory circuit. A major factor in the cost of a memory circuit is the semiconductor area required by the memory circuit. The larger the semiconductor area required for a memory circuit the greater the cost. Thus, redundancy schemes used to decrease the defect rate of memory circuits tend to increase the cost of each memory circuit because a relatively large semiconductor area is needed to accommodate redundant memory array 210. Furthermore, to provide greater redundancy requires a larger redundant memory array, which requires even more semiconductor area. Thus, the additional cost of using redundant memory arrays significantly increases the cost of memory circuits. Hence, there is a need for a method and a circuit to salvage memory circuits having non-functional memory cells without greatly increasing the cost the memory circuit.

SUMMARY

Accordingly, the present invention reduces the cost of memory circuits by providing an alternative to using redundant memory cells to salvage a memory circuit having non-functional memory cells. Rather than attempting to substitute redundant memory cells for non-functional memory cells, memory circuits using the principles of the present invention avoid the non-functional memory cells by remapping addresses away from non-functional memory cells. Instead of using redundant memory cells, the non-functional memory cells are simply not addressed. While ignoring non-functional memory cells reduces the effective size of the memory circuit, significant cost reductions are achieved because redundant memory cells are not needed. That is, since redundant memory cells are not added, memory circuits in accordance with the present invention require less semiconductor area and are therefore less costly to produce than memory circuit using redundant memory cells.

In one embodiment of the present invention, a memory circuit includes a memory array, an address decoder, a data tranceiver, and an address mapping circuit. The memory array is divided into a partitions, i.e. a group of memory cells. If all the partitions are functional partitions (i.e., the partitions contain only functional memory cells) the address mapping circuit is disabled and addresses are not remapped. However, if some of the partitions are non-functional partitions (i.e., the partitions contain non-functional memory cells) then the address mapping circuit is configured to remap addresses for the non-functional partitions into addresses for functional partitions.

Specifically, in one embodiment, a mapping scheme reduces the size and address space of the memory circuit to half the size of the memory array by selecting a subset of functional partitions that together make up half of the memory array. The reduced address space addresses only the selected subset of functional partitions. Addresses for partitions not included in the selected subset of functional partitions are remapped into addresses for a partitions in the selected subset.

In accordance with another embodiment of the present invention, the address mapping circuit includes a first multiplexer having a first input terminal coupled to a first address line of an address bus, a second input terminal coupled to a second address line of the address bus through an inverter, and an output terminal coupled to a first internal address line of an internal address bus. The address mapping circuit also includes a second multiplexer having a first input terminal coupled to a second address line of the address bus, a second input terminal coupled to the first address line of the address bus, and an output terminal coupled to a second internal address line of the address bus. The first and second multiplexers also include select terminals coupled to a map selector circuit. The map selector can be configured to select different mapping schemes of the memory array. If the memory array of the memory circuit contains only functional partitions, the address mapping circuit is configured to address the entire memory array. However, if the memory array contains non-functional partitions, the address mapping circuit is configured to enable only functional partitions of the memory array.

The present invention will be more fully understood in view of the following description and drawings.

DETAILED DESCRIPTION

As explained above, to be competitive, a producer of memory circuit must provide large memory circuits (i.e., with a large number of memory cells) at a low cost. The market for memory circuits is typically divided into a high end market and a mass market. Consumers in the high end market require the large memory circuit and are willing to pay a premium for large memory circuits. Consumers in the mass market prefer large memory circuits but are unwilling to pay premium prices for large memory circuits. Thus, producers who can produce large memory circuits at a low cost can achieve high profitability by selling the large memory circuits in the high end market. However, large memory circuits have higher defect rates, which increases the average cost per saleable memory circuit. As explained above, conventional redundancy schemes can decrease defect rates but also increase the size and cost of the memory circuit. The increased costs lowers the profitability of the large memory circuits.

The present invention allows low cost large memory circuit without using redundancy schemes. Specifically, in accordance with one embodiment of the present invention, a large memory circuit for the high end market, which contains non-functional memory cells, is reconfigured for the mass market by reducing the address space of the large memory circuit to avoid the non-functional memory cells. Thus, by using the present invention, a producer can manufacture low cost large memory circuit for the high end market and mitigate the loss caused by non-functional memory cells by reconfiguring memory circuits with non-functional memory cells as smaller memory circuits for the mass market. For example, a memory producer may produce two megabyte FLASH RAM memory circuits for the high end market. By not including redundancy circuits, the memory producer's cost per memory circuit is minimized. However, the memory circuits without redundancy schemes will likely have a larger defect rate. By using the principles of the present invention, most of the defective two megabyte FLASH RAM memory circuits can be salvaged by reconfiguring the defective two megabyte FLASH RAM memory circuits into one megabyte FLASH RAM for sale into the mass market. The increased profit per memory circuit sold in the high end market coupled with the profits from the memory circuits sold to the mass market is likely to be greater than the profitability of memory circuits using redundancy schemes for the high end market.

Figure 1:
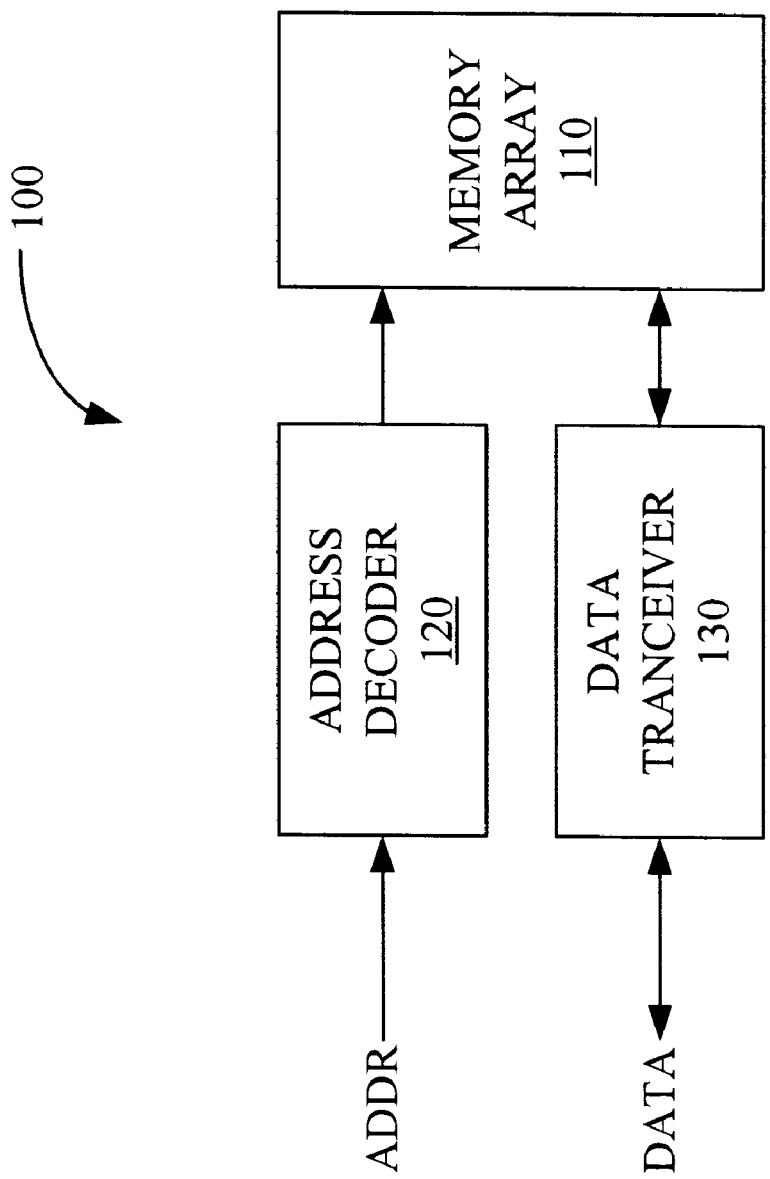
FIG. 1 is a block diagram of conventional memory circuit.
Figure 2:
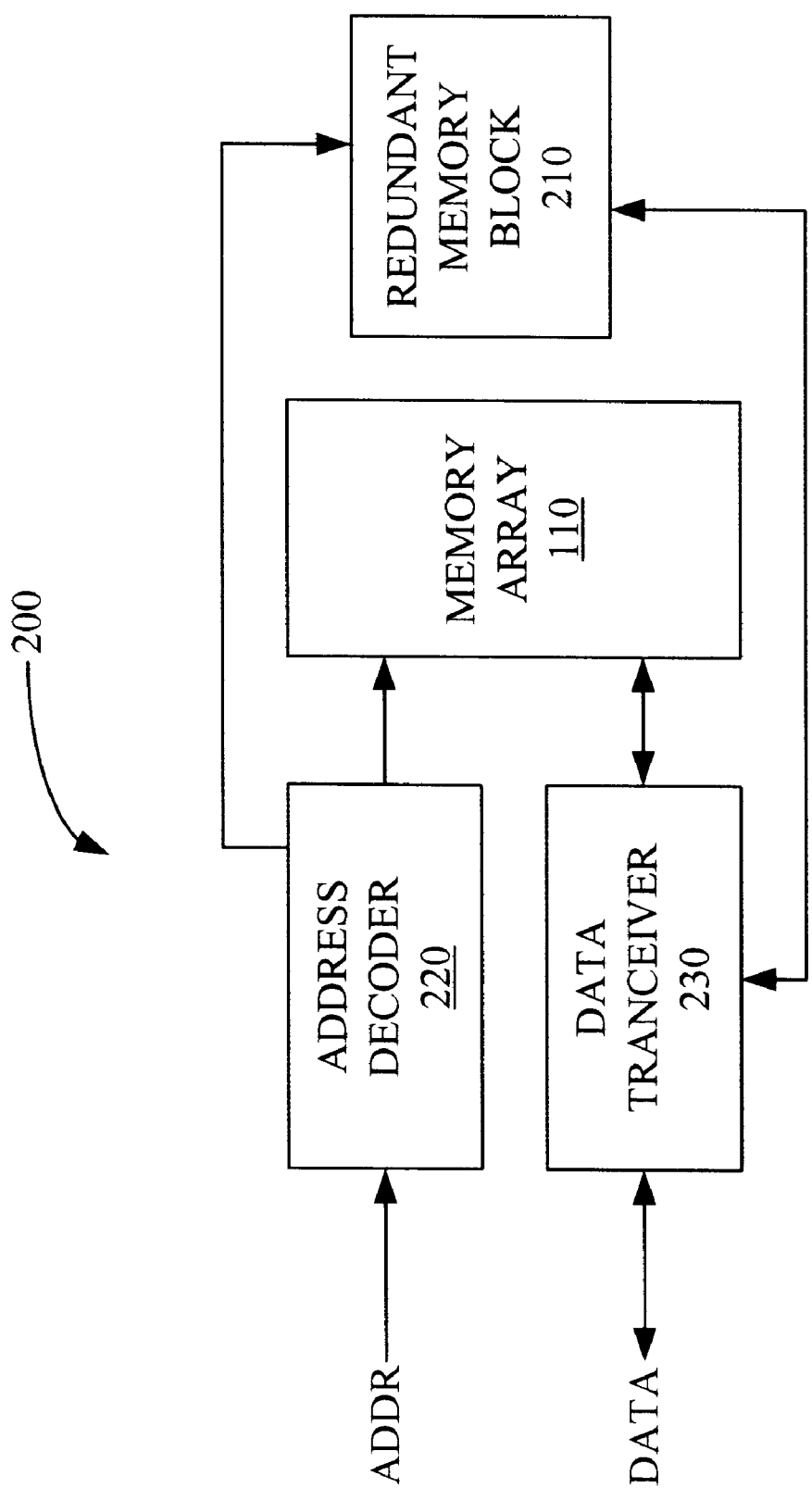
FIG. 2 is block diagram of a conventional memory circuit including redundant memory cells.
Figure 3:
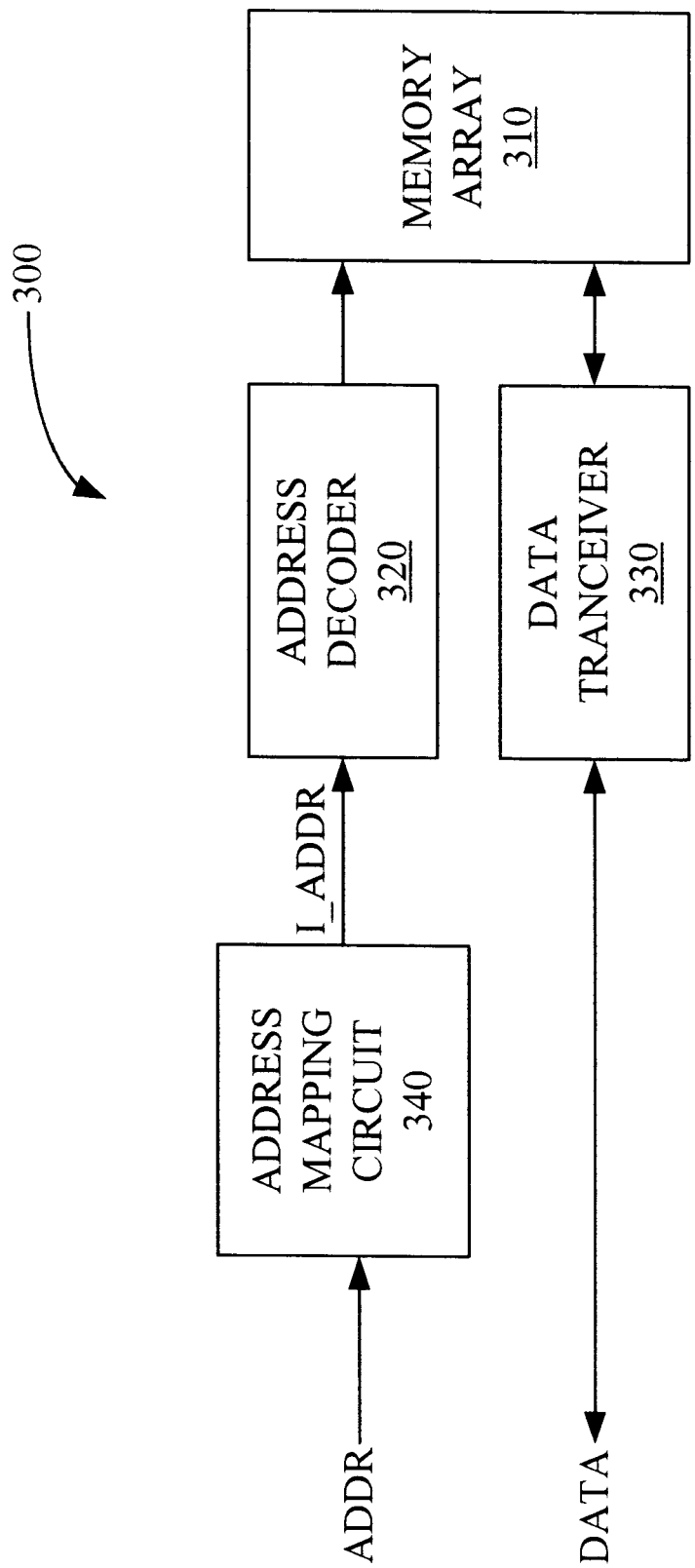
FIG. 3 is a block diagram of a memory circuit in accordance with one embodiment of the present invention.

FIG. 3 is a block diagram of a memory circuit 300 in accordance with one embodiment of the present invention. Memory circuit 300 includes an address mapping circuit 340, an address decoder 320, a memory array 310, and a data tranceiver 330. Address mapping circuit 340 receives addresses on address bus ADDR and drives internal addresses to address decoder 320 on an internal address bus I_ADDR. Internal address bus I_ADDR comprises N address lines, referred to as I_A[N-1], I_A[N-2], . . . , I_A[0], where I_A[N-1] is the most significant bit of internal address bus I_ADDR. To avoid confusion, the individual bits of an address on internal address bus I_ADDR are also referred to by I_A[N-1], . . . , I_A[0], where I_A[N-1] is the most significant bit.

If memory array 310 does not contain non-functional memory cells, address mapping circuit 340 is disabled, i.e., configured to pass addresses from address bus ADDR to address decoder 320 without change. However, if memory array 310 contains non-functional memory cells, address mapping circuit 340 remaps the addresses from address bus ADDR to avoid the non-functional memory cells of memory array 310. Specifically, address mapping circuit 340 reduces the address space of memory array 310 so that only part of memory array 310 is accessible. More specifically, address mapping circuit 340 selects a remapping scheme so that none of the non-functional memory cells of memory array 310 are accessible.

The remapping performed by address mapping circuit 340 is completely transparent to address decoder 320, memory array 310, and data tranceiver 330. Thus, one skilled in the art can adapt the principles of the present invention to use address mapping circuit 340 with any address decoder, memory array, and data tranceiver.

In accordance with one embodiment of the present invention, when memory array 310 contains non-functional memory cells, address mapping circuit 340 cuts the address space of memory circuit 300 in half. Thus, address bit A[N-1], i.e., the most significant address bit, is not used. For example, a two megabyte (8 bits per data word) memory circuit, which is addressed by eighteen address bits, becomes a one megabyte memory circuit, addressed by seventeen address bits. Specifically, memory array 310 is divided into X partitions, where X is an even number. Most embodiments use a power of two for X. If any of the X partitions are non-functional partitions (i.e., partition containing non-functional memory cells), address mapping circuit 340 selects Y (where Y equals X/2) functional partitions (i.e., partitions not containing non-functional memory cells) of memory array 310, and redefines a new address space to use the Y functional partitions as a memory circuit having half the memory size of memory array 310. If all X partitions are functional partitions, address mapping circuit 340 passes all address bits on address bus ADDR to internal address bus I_ADDR without remapping. Address mapping circuit 340 remaps the address space of memory circuit 310 by manipulating the most significant bits of addresses from address bus ADDR. Specifically, address decoder 340 remaps the $\log_2$ (X) most significant bits of each address, where X is equal to the number of partitions as defined above. If $\log_2$ (X) is not an integer, address decoder 340 must remap the (one+ int($\log_2$ (X)) most significant bits, where int($\log_2$ (X)) is equal to the integer portion of $\log_2$ (X). Some embodiments of address decoder 340 use configurable selecting circuits, such as multiplexers, to rearrange the coupling between address lines A[N-1:N-$\log_2$ (X)] and internal address lines I_A[N-1:N-$\log_2$ (X)]. Other embodiments may calculate remapped address from the bits of the addresses on address bus ADDR using combinatorial logic.

FIG. 4(a)–(g) illustrates the partitioning of memory array 310 into four partitions (i.e., X=4), and the possible ways to select two partitions (i.e., Y=2) to create a memory circuit having half the size of memory array 310. In FIGS. 4(a)–(g) the non-shaded partitions are the selected partitions, and are thus functional partitions. The shaded partitions are not selected because at least one shaded partition is a non-functional partition. Specifically, as shown in FIGS. 4(a)–4(g) memory circuit 310 is divided into partitions 310_0, 310_1, 310_2, and 310_3. Partitions 310_3, 310_2, 310_1, and 310_0 are enabled if internal address lines I_A[N:N—1] are equal to 11, 10, 01, and 00, respectively.

Figure 4D:
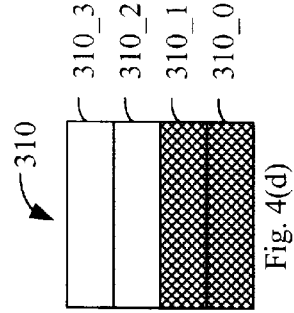
FIGS. 4(*a*)–4(*g*) are diagrams illustrating a mapping scheme in accordance with one embodiment of the present invention.
Figure 4C:
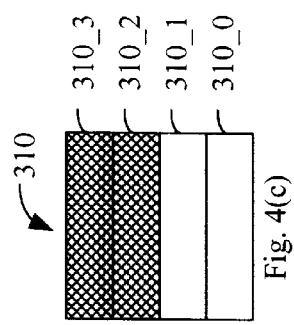
Figure 4G:
Figure 4B:
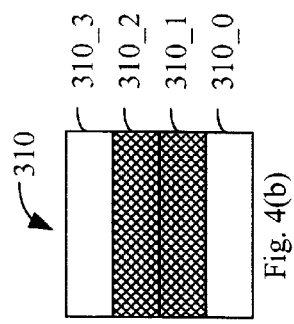
Figure 4F:
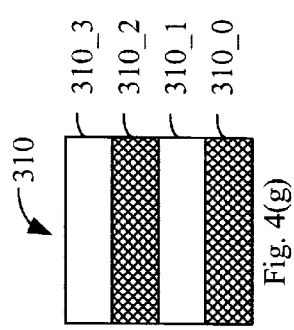
Figure 4A:
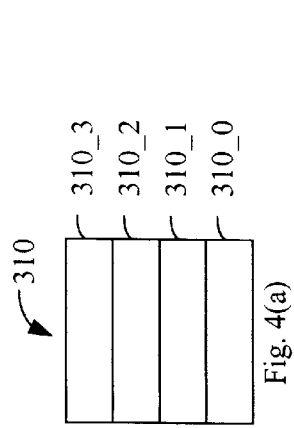
Figure 4E:
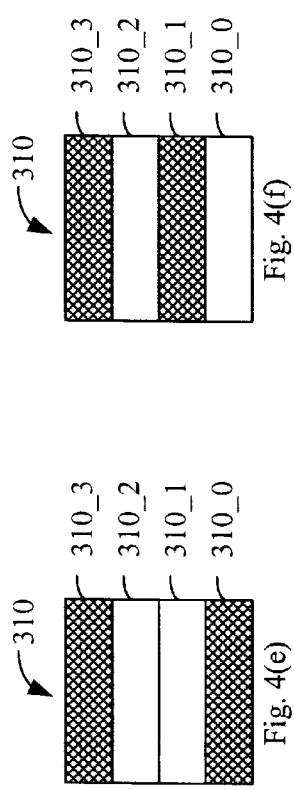

In FIG. 4(a), all the memory cells of memory array 310 function properly, thus address mapping circuit 340 does not remap the addresses from address bus ADDR. In FIGS. 4(b)–4(g) at least one of partitions 310_3, 310_2, 310_1, and 310_0 is a non-functional partition. Thus, memory circuit 300 must be reconfigured to use only half of memory array 310. As explained above, address bit A[N-1] is not used if memory circuit 300 is reconfigured. Therefore, address bit A[-2] becomes the most significant bit and must be used to determine which partition is activated. If non-functional memory cells are located only in partitions 310_2 and 310_1, as illustrated in FIG. 4(b), partitions 310_3 and 310_0 are used by memory circuit 300. Specifically, if address bit A[N-2] equals 1, partition 310_3 should be activated. Accordingly, internal address bits I_A [N-1:N-2] should be set equal to 11. If address bit A[N-2] equals 0, partition 310_0 should be activated. Accordingly, internal address bits I_A[N-1:N-2] should be set equal to 00. Table 1 shows the various values of internal bits I_A [N-1:N-2] to use the mapping scheme illustrated by FIGS. 4(b)–4(f).

TABLE 1

| FIG. | A [N−2] = 1 | A [N−2] = 0 |
|---|---|---|
| 4 (b) | I_A [N−1:N−2] = 11 | I_A [N−1:N−2] = 00 |
| 4 (c) | I_A [N−1:N−2] = 01 | I_A [N−1:N−2] = 00 |
| 4 (d) | I_A [N−1:N−2] = 11 | I_A [N−1:N−2] = 10 |
| 4 (e) | I_A [N−1:N−2] = 10 | I_A [N−1:N−2] = 01 |
| 4 (f) | I_A [N−1:N−2] = 10 | I_A [N−1:N−2] = 00 |
| 4 (g) | I_A [N−1:N−2] = 11 | I_A [N−1:N−2] = 01 |

Table 1(a) shows the value of I_A[N−1] and I_A[N−2], as derived from Table 1, for each mapping scheme illustrated by FIGS. 4(a)–4(f) as a function of A[N−1], A[N−2], logic 0, or logic 1.

TABLE 1 (a)

| FIG. | I_A [N−1] | I_A [N−2] |
|---|---|---|
| 4 (a) | A [N−1] | A [N−2] |
| 4 (b) | A [N−2] | A [N−2] |
| 4 (c) | 0 | A [N−2] |
| 4 (d) | 1 | A [N−2] |
| 4 (e) | A [N−2] | !A [N−2] |
| 4 (f) | A [N−2] | 0 |
| 4 (g) | A [N−2] | 1 |

When each instance of memory circuit 310 is produced, memory array 310 must be tested to determine which partitions are functional partitions and which partitions are non-functional partitions. If all four partitions are functional partitions, address mapping circuit 340 is configured to pass addresses from address bus ADDR to internal address bus I_ADDR without remapping. If one partition is a non-functional partition and at least two partitions are functional partitions, address mapping circuit 340 is configured to remap addresses on address bus ADDR as described above with respect to Table 1 and FIGS. 4(b)–4(g) to use only two functional partitions of memory array 310. If an instance of memory circuit 310 has three or more non-functional partitions, that instance of memory circuit 310 must be discarded. However, other embodiments of the present invention described below may be able to salvage such memory circuits.

Figure 5:
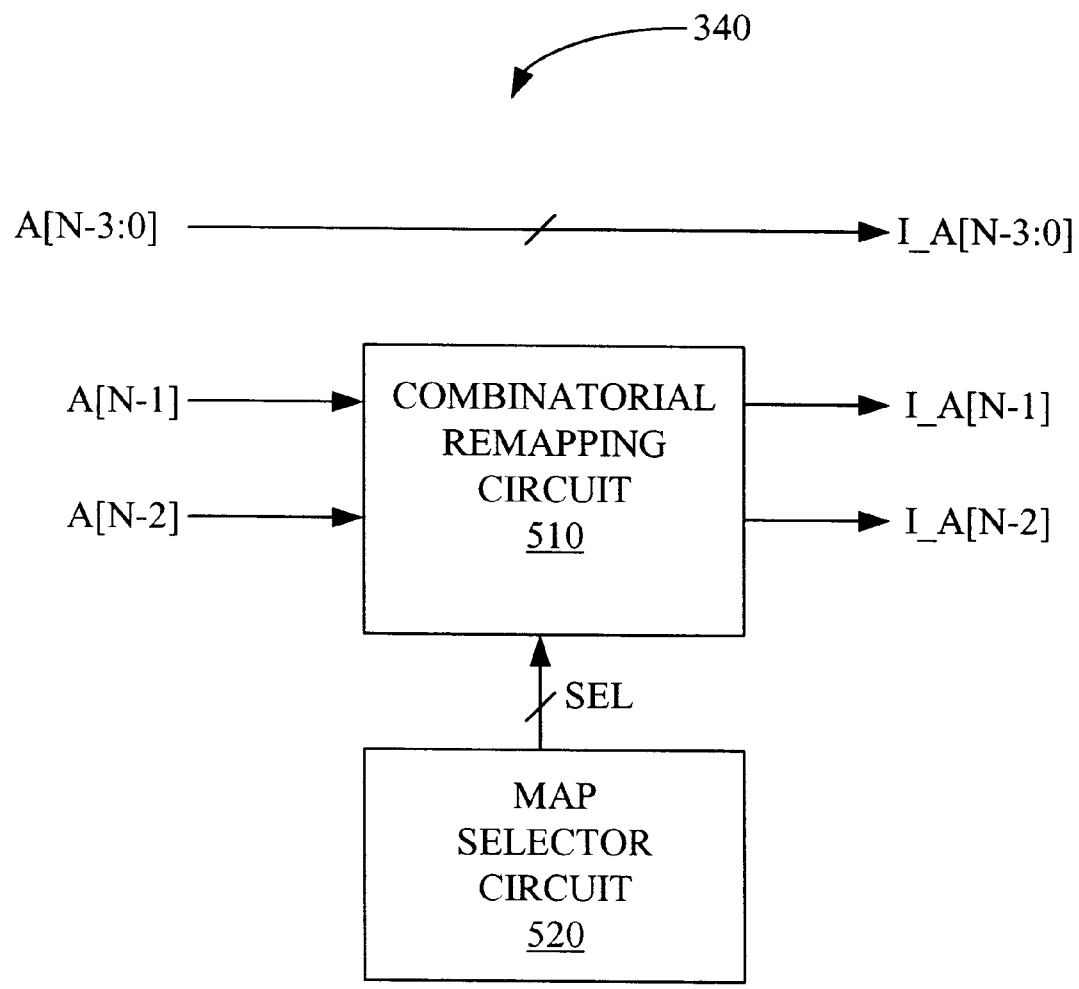
FIG. 5 is a block diagram of an address mapping circuit in accordance with one embodiment of the present invention.

FIG. 5 is a block diagram of one embodiment of address mapping circuit 340 for X equals 4 and Y equals 2. The embodiment of FIG. 5 comprises a combinatorial re-mapping circuit 510, and a map selector circuit 520. In the embodiment of FIG. 5, address lines A[N−3:0] of address bus ADDR are directly coupled to internal address lines A[N−3:0] of internal address bus I_ADDR because only the two most significant bits of address bus ADDR are remapped. Map selector circuit 520 contains non-volatile memory, such as floating gate memory cells, fuses, or anti-fuses, that are programmed to select the mapping options for memory circuit 310. Map selector 520 drives selection signals SEL to combinatorial remapping circuit 510. Combinatorial remapping circuit 510 drives internal address lines I_A[N−1] and I_A[N−2] based on the state of selection signals SEL and the state of address bits A[N−1:N−2] on address lines A[N−1:N−2]. Equations 1 and 2 (below) implement the remapping scheme of Table 1, Table 1(a) and FIGS. 4(a)–4(g), assuming FIGS. 4(a)–4(g) are selected by selection signals SEL being in state 000, 001, 010, 011, 100, 101, and 110, respectively. As used herein, "#" refers to logic OR, and "&" refers to logic AND.

$$\begin{aligned}I\_A[N-1] = &(SEL=000 \ \& \ A[N-1]) \ \# \ (SEL=001 \ \& \ A[N-2]) \\ &\# \ (SEL=010 \ \& \ 0) \ \# \ (SEL=011 \ \& \ 1) \\ &\# \ (SEL=100 \ \& \ A[N-2]) \ \# \ (SEL=101 \ \& \ A[N-2]) \\ &\# \ (SEL=110 \ \& \ A[N-2]).\end{aligned} \quad \text{EQ (1)}$$

$$\begin{aligned}I\_A[N-2] = &(SEL=000 \ \& \ A[N-2]) \ \# \ (SEL=001 \ \& \ A[N-2]) \\ &\# \ (SEL=010 \ \& \ A[N-2]) \ \# \ (SEL=011 \ \& \ A[N-2]) \\ &\# \ (SEL=100 \ \& \ !A[N-2]) \ \# \ (SEL=101 \ \& \ 0) \\ &\# \ (SEL=110 \ \& \ 1).\end{aligned} \quad \text{EQ (2)}$$

Figure 6:
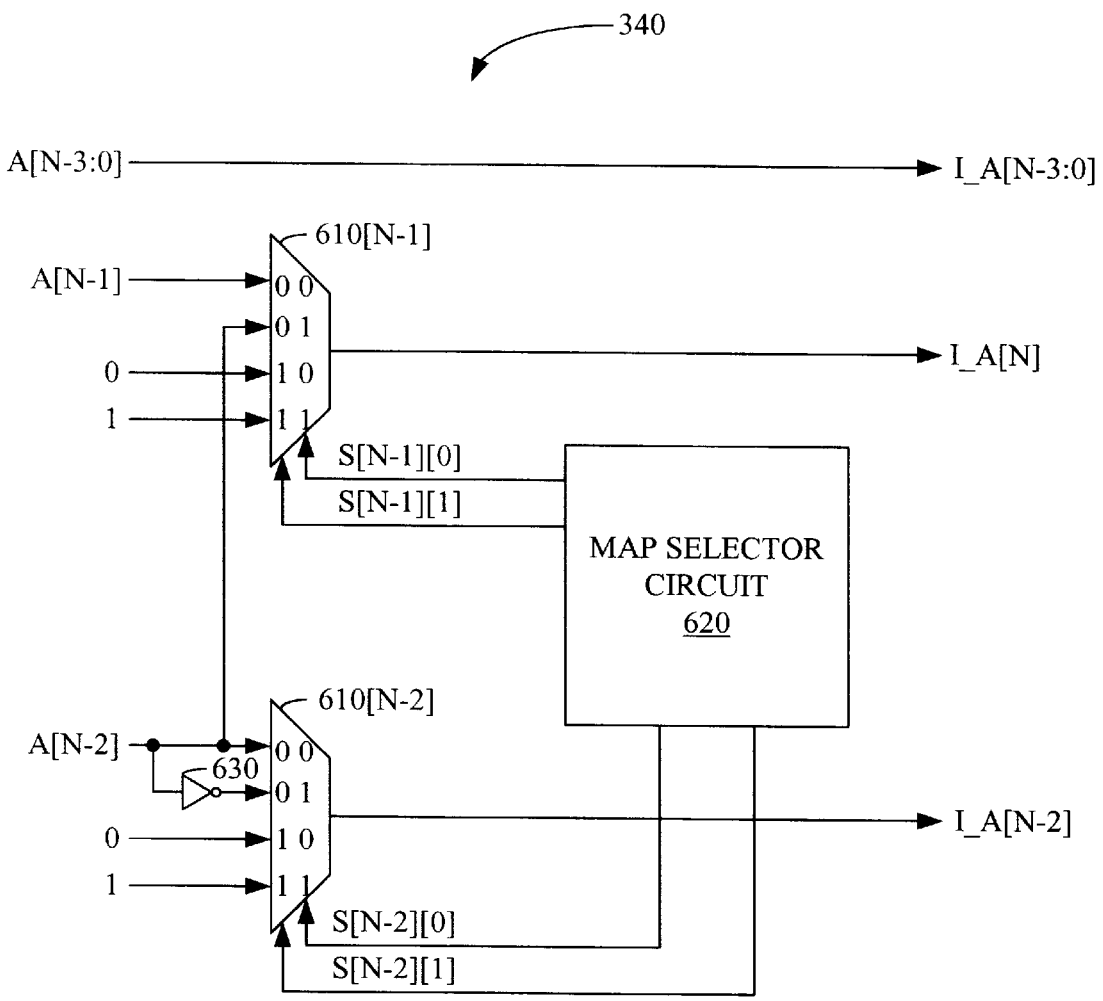
FIG. 6 is a block diagram of an address mapping circuit in accordance with another embodiment of the present invention.

FIG. 6 is another embodiment of address mapping circuit 340 for X equal 4 and Y equals 2. The embodiment of FIG. 6 uses selection circuits, such as multiplexers, to selectively couple address lines of address bus ADDR to internal address lines of internal address bus I_ADDR. Specifically, the embodiment of FIG. 6 comprises a multiplexer 610[N−1], a multiplexer 610[N−2], a map selector circuit 620, and an inverter 630. In the embodiment of FIG. 6, address lines A[N−3:0] of address bus ADDR are directly coupled to internal address lines A[N−3:0] of internal address bus I_ADDR because only the two most significant bits of address bus ADDR are remapped. Map selector circuit 620 drives select lines S[N−1] [1:0] to control multiplexer 610[N−1] and select lines S[N−2] [1:0] to control multiplexer 620[N−2]. Multiplexers 610[N−1] and 620[N−2] can be implemented using conventional multiplexers.

As illustrated in FIG. 6, the first, second, third, and fourth input terminal of multiplexer 610[N−1] are coupled to address line A[N−1], address line A[N−2], logic zero, and logic one. The output terminal of multiplexer 610[N−1] is coupled to address line I_A[N−1]. The first, second, third, or fourth input terminal of multiplexer 610[N−1] is coupled to the output terminal of multiplexer 610[N−1] if the signals on select lines S[N−1] [1:0] are equal to 00, 01, 10, or 11, respectively. The first, third, and fourth input terminals of multiplexer 610[N−2] are coupled to address line A[N−2], logic zero, and logic one. Address line A[N−2] is coupled to the second input terminal of multiplexer 610_2 through inverter 630. The output terminal of multiplexer 610[N−1] is coupled to address line I_A[N−2]. The first, second, third, or fourth input terminal of multiplexer 610[N−2] is coupled to the output terminal of multiplexer 610[N−2] if the signals on select lines S[N−2] [1:0] are equal 00, 01, 10, or 11, respectively.

Table 2 shows the values for the signals on select lines S[N−1][1:0] and S[N−2][1:0] that are used to implement the mapping scheme illustrated in FIGS. 4(a)–4(g).

TABLE 2

| FIG. | S [N-1] [1:0] | S [N-2] [1:0] |
|------|---------------|---------------|
| 4 (a) | 00 | 00 |
| 4 (b) | 01 | 00 |
| 4 (c) | 10 | 00 |
| 4 (d) | 11 | 00 |
| 4 (e) | 01 | 01 |
| 4 (f) | 01 | 10 |
| 4 (g) | 01 | 11 |

Figure 7C:
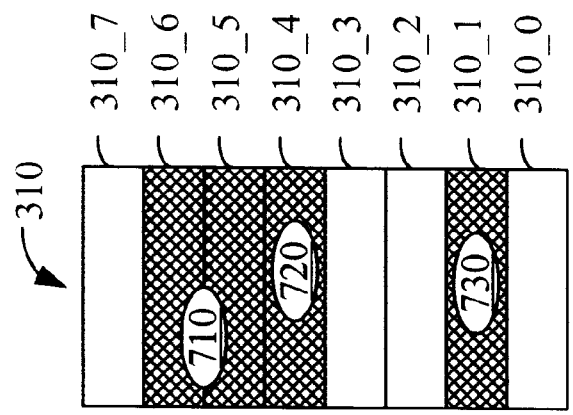
FIGS. 7(*a*)–7(*c*) are a diagrams illustrating error patterns in a memory array.
Figure 7B:
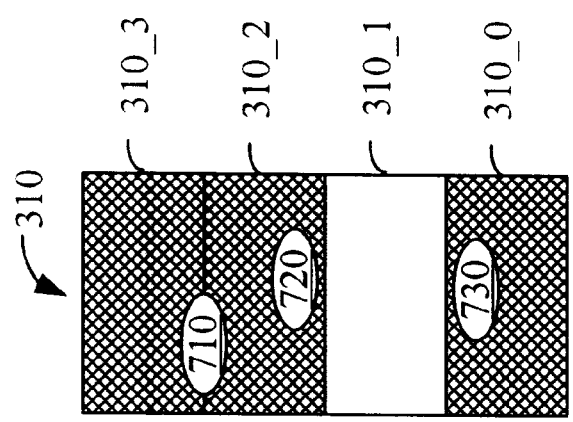
Figure 7A:
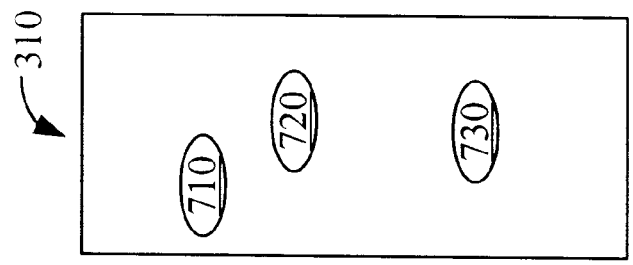

As explained above, the specific embodiments of address mapping circuit 340 in FIGS. 4 and 5 can not salvage an instance of memory circuit 300 if memory array 310 has three or more non-functional partitions. However, as explained above, X, the number of partitions, is not limited to 4. By using a greater number of smaller partitions, the present invention can use more versatile mapping schemes to salvage more instances of memory circuit 300. For example, FIG. 7(a) illustrates an error pattern in memory array 310. Specifically, error spots 710, 720, and 730 indicate non-functional memory cells. As shown in FIG. 7(b), if memory array 310 is divided into four partitions 310_0, 310_1, 310_2, 310_3, only partition 310_1 is a functional partition. Thus, address mapping circuit 340 can not salvage this instance of memory circuit 300. However, if memory array 310 were divided into eight partitions as illustrated in FIG. 7(c), memory array 310 has four functional partitions, specifically, partitions 310_0, 310_2, 310_3, and 310_7. Since half of the partitions of memory array 310 are functional, address mapping circuit 340 can salvage memory circuit 300.

In general, the principles of the present invention can be used when dividing memory array 310 into any number of partitions. If the manufacturing process of memory circuit 300 tends to have many small groups of non-functional memory cells, a larger number of partitions should be used to divide memory array 310. For processes that have very few groups of non-functional memory cells, a smaller number of partitions can be used to divide memory array 310.

As the number of partitions increases, so does the number of possible mapping schemes of memory array 310. Specifically, the number of possible mapping schemes of memory array 310 is equal to one plus the number of combinations of X taken Y at a time (i.e., $1+{}_xC_y$) where X is the number of partitions and Y is equal to X/2. The additional one is for the mapping scheme using all the partitions of memory array 310 (i.e., when there are no non-functional memory cells in memory array 310). For example, as illustrated in FIGS. 4(a)–4(g), when X=4 and Y=2, the number of mapping schemes is equal to 7 (i.e., $1+{}_4C_2=1+6$). For X=8 and Y=4, the number of mapping schemes increases to 71. For X=16 and Y=8, the number of mapping schemes increases to 12,870. For X=32 and Y=16 the number of mapping schemes increases to 601,080,390. Thus, when the number of partitions becomes large, address mapping circuit 340 becomes very complicated if all possible mapping schemes are supported. Therefore, many embodiments of the present invention only support a subset of the possible mapping schemes for a particular X and Y. Generally, the supported mapping schemes should provide for a variety of possible error patterns.

Figure 8A:
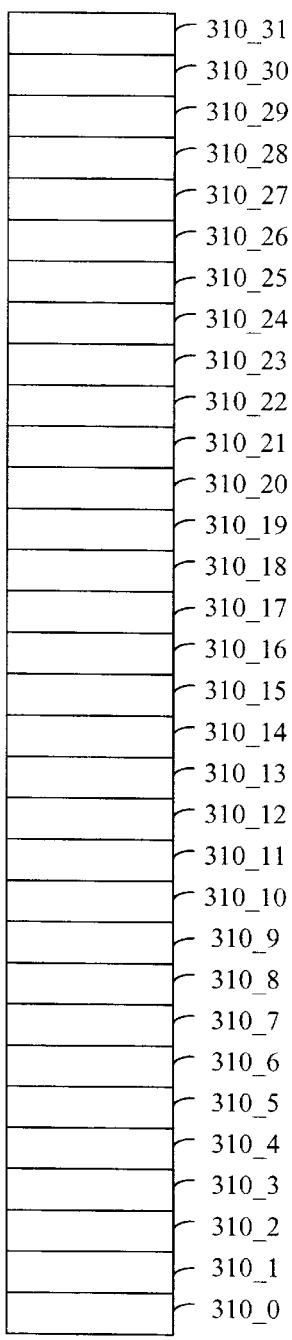
FIGS. 8(*a*)–8(*p*) are a diagrams illustrating a mapping scheme in accordance with one embodiment of the present invention.
Figure 8B:
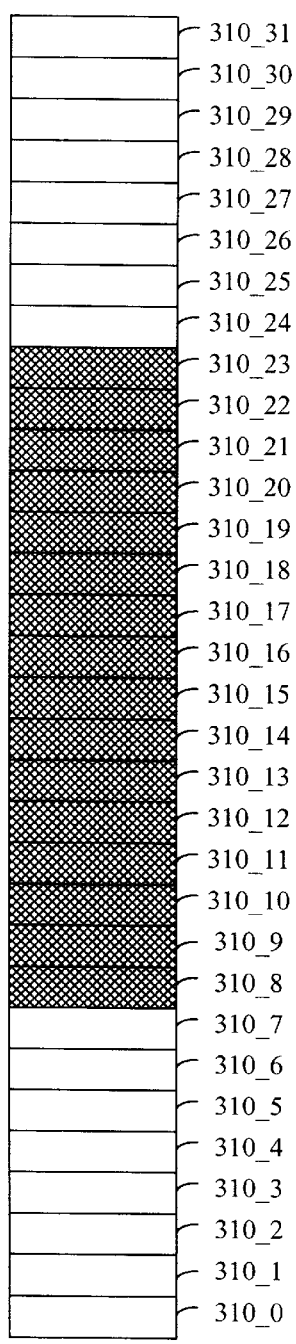
Figure 8C:
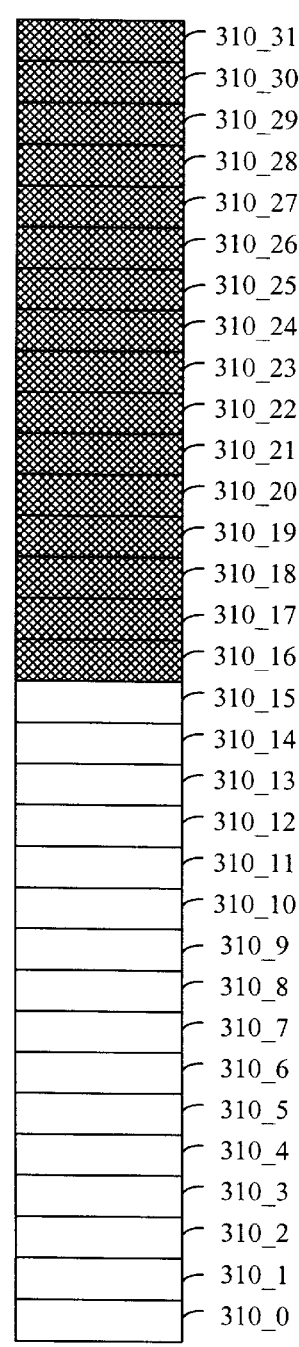
Figure 8D:
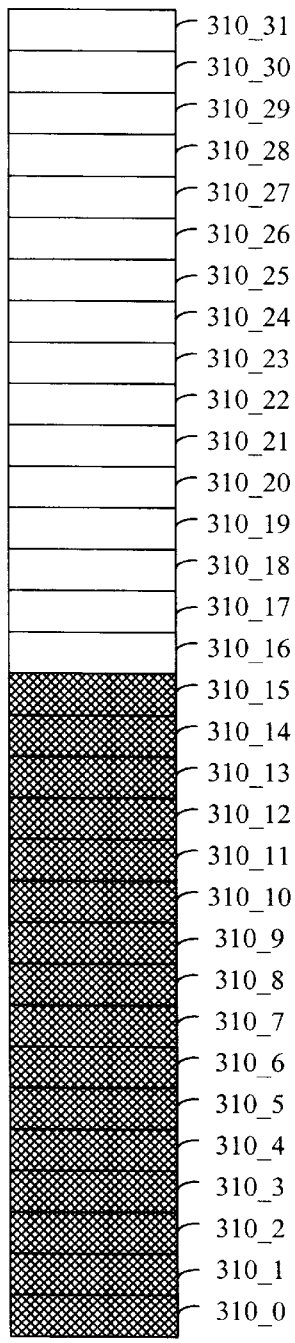
Figure 8E:
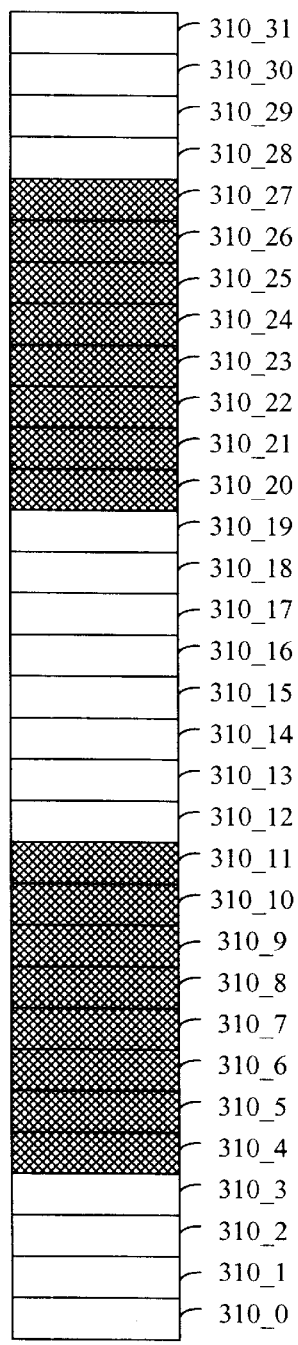
Figure 8F:
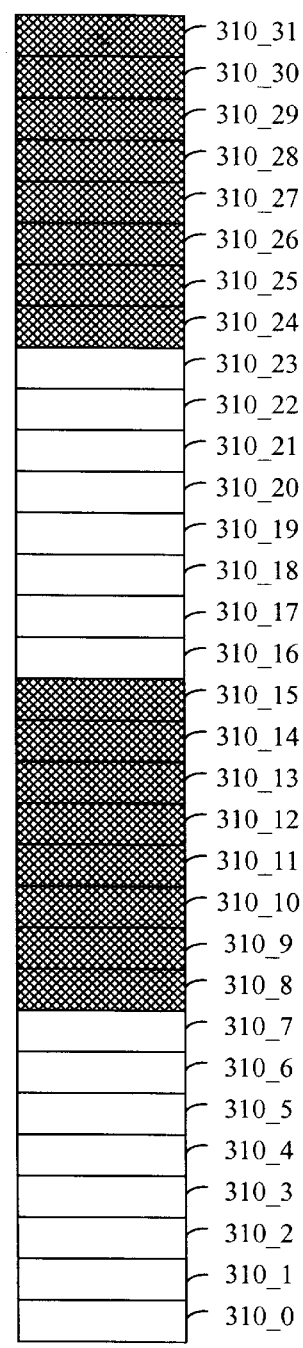
Figure 8G:
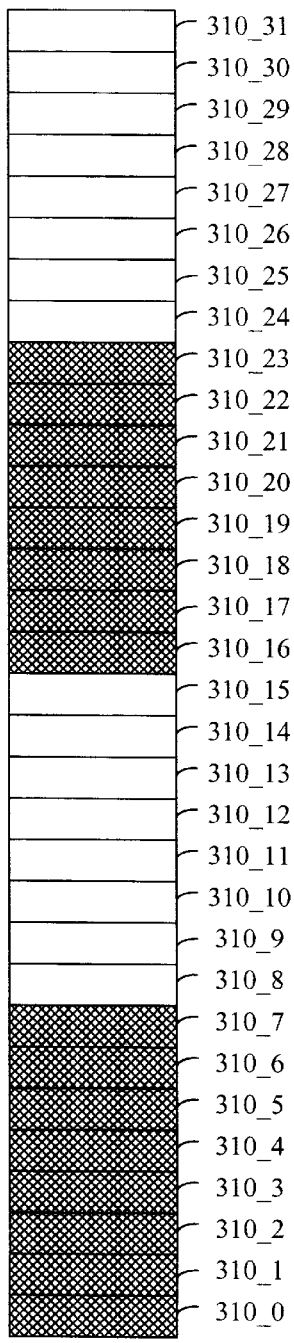
Figure 8H:
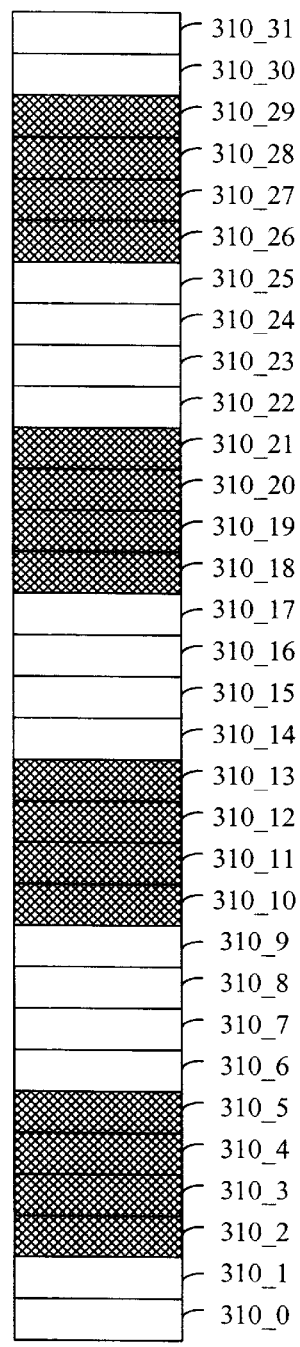
Figure 8I:
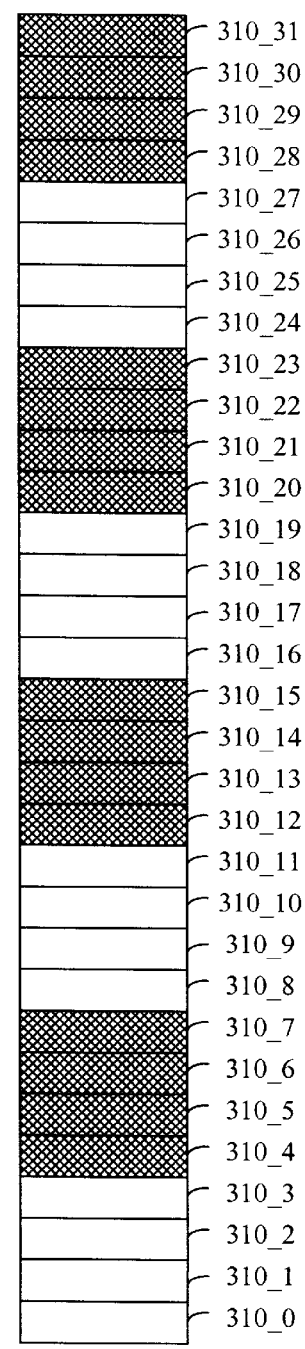
Figure 8J:
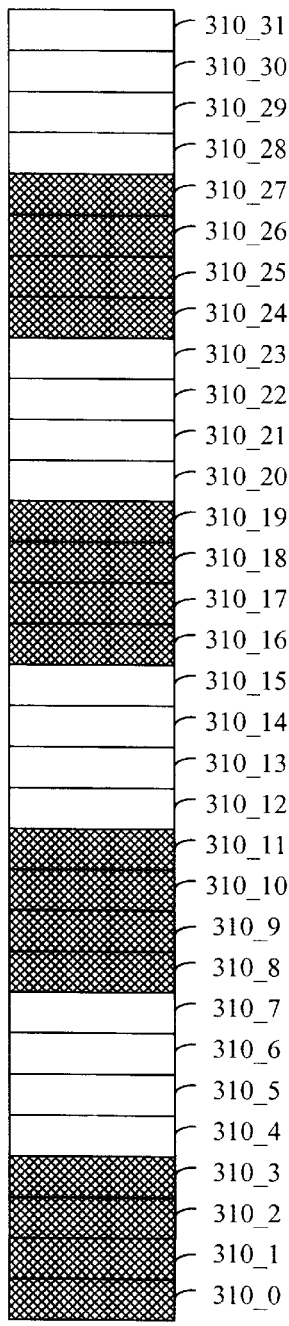
Figure 8K:
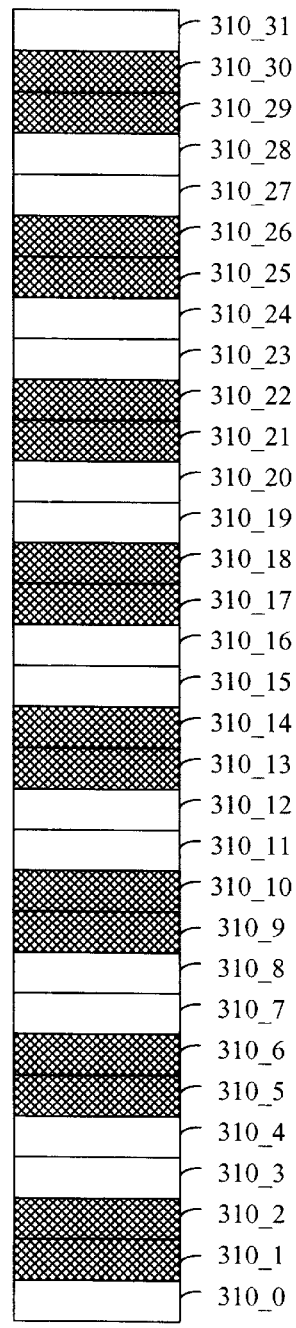
Figure 8L:
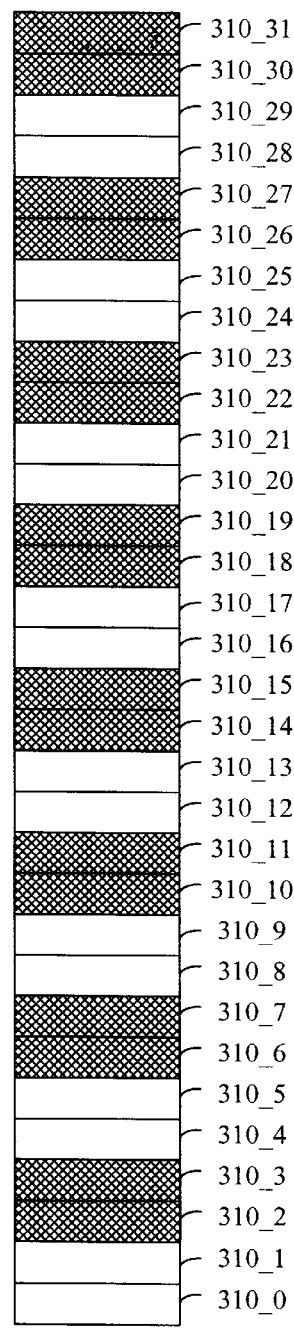
Figure 8M:
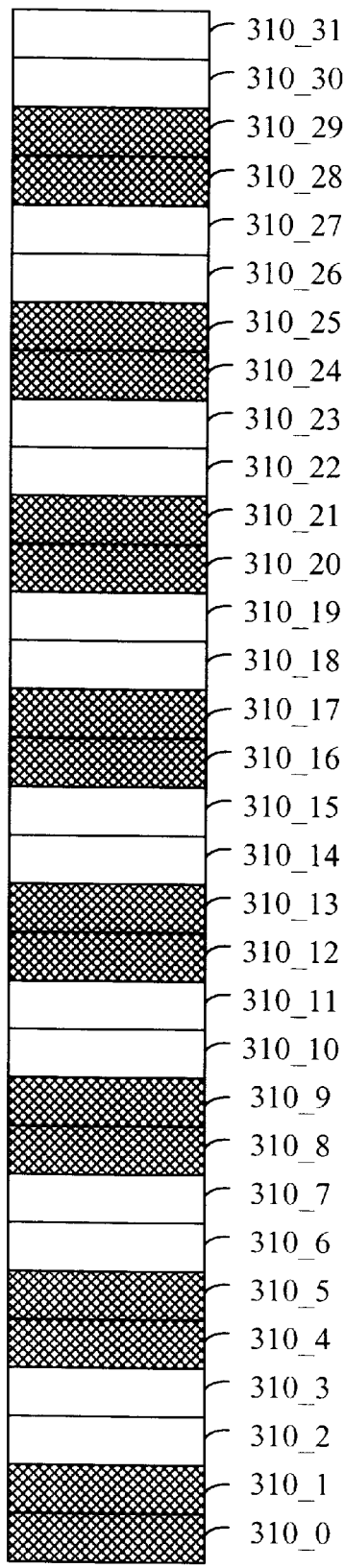
Figure 8N:
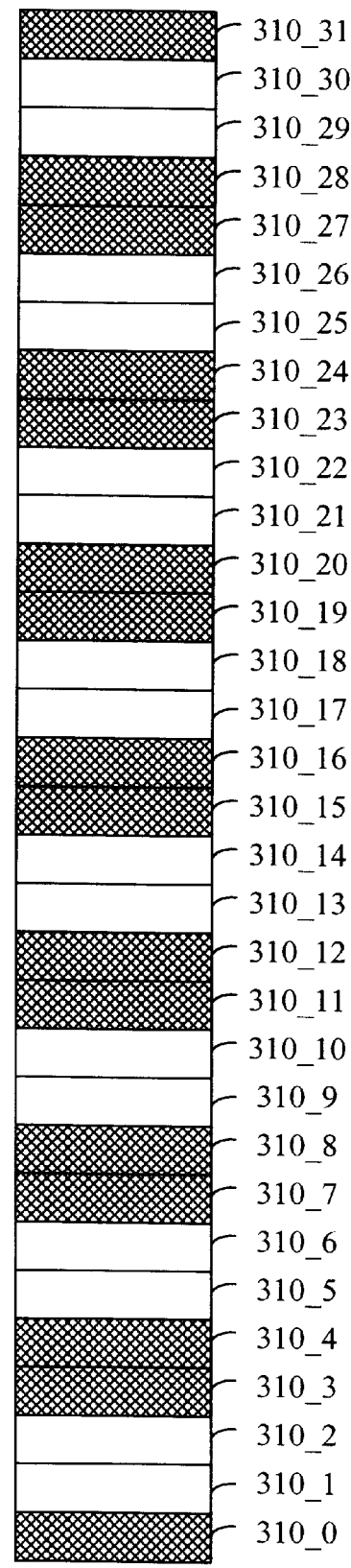
Figure 8O:
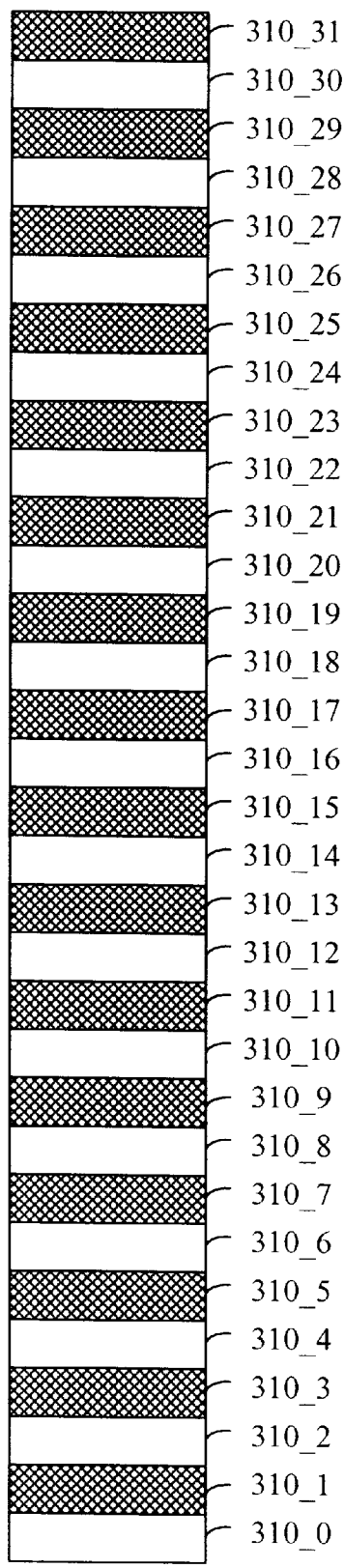
Figure 8P:
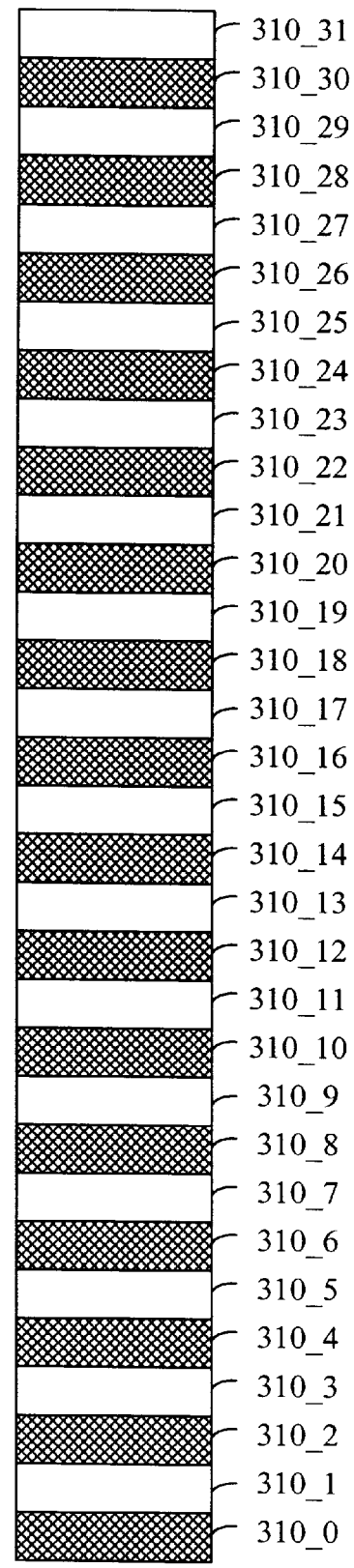

FIGS. 8(a)–8(p) show the mapping scheme for an embodiment of the present invention (FIG. 9) using 32 partitions (i.e., X=32, Y=16) for memory array 310. Each partition 310_p is enabled if the number formed by the five most significant bits of an address is equal to p. For example, to enable partition 310_0, internal address lines I_A[N-1:N-5] must equal 00000. Similarly to enable partition 310_12, internal address lines I_A[N-1:N-5] must equal 01100 (i.e., 12 in binary). In FIGS. 8(a)–8(p), unshaded partitions are selected because the unshaded partitions are all functional partitions and shaded partitions are not selected because the at least one shaded partition is a non-functional partition. Unless an instance of memory array 310 has an excessive amount of non-functional memory cells, at least one of the mapping schemes shown in FIGS. 8(a)–8(p) should be able to salvage memory circuit 300. Table 3 shows how address lines A[N-1:N-5] of address bus ADDR are mapped to internal address lines I_A[N-1:N-5] of internal address bus I_ADDR to implement the various mapping schemes of FIGS. 8(a)–8(p). In Table 3, "0" is logic low as provided by a logic low source, "1" is logic high as provided by a logic high source, and "!A[N-4]" denotes an inverted version of a address line A[N-4].

TABLE 3

| FIG. | I_A [N-1] | I_A [N-2] | I_A [N-3] | I_A [N-4] | I_A [N-5] |
|------|-----------|-----------|-----------|-----------|-----------|
| 8 (a) | A [N-1] | A [N-2] | A [N-3] | A [N-4] | A [N-5] |
| 8 (b) | A [N-2] | A [N-2] | A [N-3] | A [N-4] | A [N-5] |
| 8 (c) | 0 | A [N-2] | A [N-3] | A [N-4] | A [N-5] |
| 8 (d) | 1 | A [N-2] | A [N-3] | A [N-4] | A [N-5] |
| 8 (e) | A [N-2] | A [N-3] | A [N-3] | A [N-4] | A [N-5] |
| 8 (f) | A [N-2] | 0 | A [N-3] | A [N-4] | A [N-5] |
| 8 (g) | A [N-2] | 1 | A [N-3] | A [N-4] | A [N-5] |
| 8 (h) | A [N-2] | A [N-3] | A [N-4] | A [N-4] | A [N-5] |
| 8 (i) | A [N-2] | A [N-3] | 0 | A [N-4] | A [N-5] |
| 8 (j) | A [N-2] | A [N-3] | 1 | A [N-4] | A [N-5] |
| 8 (k) | A [N-2] | A [N-3] | A [N-4] | A [N-5] | A [N-5] |
| 8 (l) | A [N-2] | A [N-3] | A [N-4] | 0 | A [N-5] |
| 8 (m) | A [N-2] | A [N-3] | A [N-4] | 1 | A [N-5] |
| 8 (n) | A [N-2] | A [N-3] | A [N-4] | A [N-5] | !A [N-4] |
| 8 (o) | A [N-2] | A [N-3] | A [N-4] | A [N-5] | 0 |
| 8 (p) | A [N-2] | A [N-3] | A [N-4] | A [N-5] | 1 |

Figure 9:
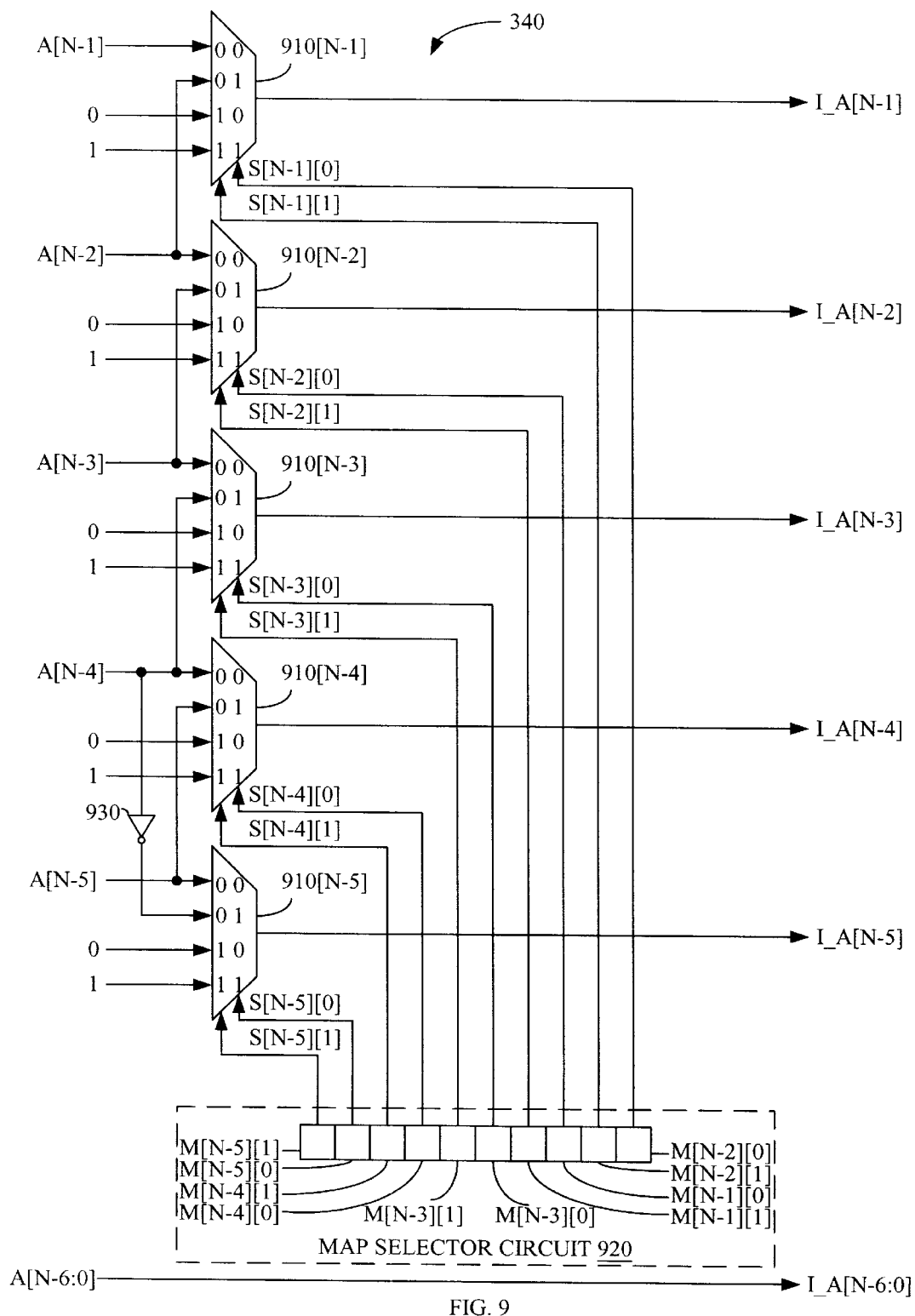
FIG. 9 is a block diagram of an address mapping circuit in accordance with another embodiment of the present invention.

FIG. 9 is a circuit diagram of an embodiment of address mapping circuit 340, which implements the mapping schemes of Table 3 and FIGS. 8(a)–8(p). The embodiment of FIG. 9 comprises an inverter 930, a map selector circuit 920, and multiplexers 910[N-1], 910[N-2], 910[N-3], 910[N-4] and 910[N-5]. Multiplexers 910[N-1]–910[N-5] each have four input terminals, an output terminal, and two select terminals.

The output terminal of multiplexer 910[N-1] drives internal address line I_A[N-1]. As shown in Table 3, for the mapping schemes of FIGS. 8(a)–8(p), internal address line I_A[N-1] is driven to equal address line A[N-1], address line A[N-2], logic 0 (i.e., logic low), or logic 1 (i.e., logic high). Accordingly the first, second, third, and fourth input terminals of multiplexer 910[N-1] are coupled to address line A[N-1], address line A[N-2], logic 0, and logic 1, respectively. In general, the output pin of multiplexer 910[N-k] drives internal address line I_A[N-k], where k is an integer between 1 and 5, inclusive. As shown in Table 3, for the mapping schemes of FIGS. 8(a)–8(p), internal address line I_A[N-j] is driven to equal address line A[N-j], address line A[N-(j+1)], logic 0, or logic 1. Accordingly, the first, second, third, and fourth input terminals of multiplexer 910[N-j] are coupled to address line A[N-j], address line A[N-(j+1)], logic 0, and logic 1, respectively, where j is an integer between 1 and 4, inclusive. As shown in Table 3, for the mapping schemes of FIGS. 8(a)–8(p), internal address line I_A[N-5] is driven to equal address line A[N-5], the inverse of the signal on address line A[N-4], logic 0, or logic 1. Accordingly the first, third, and fourth input terminals of multiplexer 910[N-5] are coupled to address line A[N-5], logic 0, and logic 1, respectively. The second input terminal of multiplexer 910[N−5] is coupled to the output terminal of inverter 930, which has an input terminal coupled to address line A[N−4].

Map selector circuit 920 drives select lines S[N−1] [1:0], S[N−2] [1:0], S[N−3] [1:0], S[N−4] [1:0], and S[N−5] [1:0] to the select terminals of multiplexers 910[N−1], 910[N−2], 910[N−2], 910[N−3], 910[N−4] and 910[N−5], respectively. In the embodiment of FIG. 9, map selector circuit 920 comprises ten non-volatile memory cells M[N−1] [1:0], M[N−2] [1:0], M[N−3] [1:0], M[N−4] [1:0], and M[N−5] [1:0]. Each non-volatile memory cell M[N−k] [p] drives select line S[N−k] [l], where k is an integer between 1 and 5, inclusive, and p is equal to 0 or 1. The ten non-volatile memory cells of map selector circuit 920 are programmed to select one of the mapping schemes of FIGS. 8(*a*)–8(*p*). Table 4 provides the appropriate values for each memory cell. In the header of Table 4, each memory cell M[N−k, p] is denoted by k|p, where k is an integer between 1 and 5, inclusive, and p is equal to 0 or 1.

TABLE 4

| FIG. | 1\|1 | 1\|0 | 2\|1 | 2\|0 | 3\|1 | 3\|0 | 4\|1 | 4\|0 | 5\|1 | 5\|0 |
|---|---|---|---|---|---|---|---|---|---|---|
| 8 (a) | 0 | 0 | 0 | 0 | 0 | 0 | 0 | 0 | 0 | 0 |
| 8 (b) | 0 | 1 | 0 | 0 | 0 | 0 | 0 | 0 | 0 | 0 |
| 8 (c) | 1 | 0 | 0 | 0 | 0 | 0 | 0 | 0 | 0 | 0 |
| 8 (d) | 1 | 1 | 0 | 0 | 0 | 0 | 0 | 0 | 0 | 0 |
| 8 (e) | 0 | 1 | 0 | 1 | 0 | 0 | 0 | 0 | 0 | 0 |
| 8 (f) | 0 | 1 | 1 | 0 | 0 | 0 | 0 | 0 | 0 | 0 |
| 8 (g) | 0 | 1 | 1 | 1 | 0 | 0 | 0 | 0 | 0 | 0 |
| 8 (h) | 0 | 1 | 0 | 1 | 0 | 1 | 0 | 0 | 0 | 0 |
| 8 (i) | 0 | 1 | 0 | 1 | 1 | 0 | 0 | 0 | 0 | 0 |
| 8 (j) | 0 | 1 | 0 | 1 | 1 | 1 | 0 | 0 | 0 | 0 |
| B (k) | 0 | 1 | 0 | 1 | 0 | 1 | 0 | 1 | 0 | 0 |
| 8 (l) | 0 | 1 | 0 | 1 | 0 | 1 | 1 | 0 | 0 | 0 |
| 8 (m) | 0 | 1 | 0 | 1 | 0 | 1 | 1 | 1 | 0 | 0 |
| 8 (n) | 0 | 1 | 0 | 1 | 0 | 1 | 0 | 1 | 0 | 1 |
| 8 (o) | 0 | 1 | 0 | 1 | 0 | 1 | 0 | 1 | 1 | 0 |
| 8 (p) | 0 | 1 | 0 | 1 | 0 | 1 | 0 | 1 | 1 | 1 |

One skilled in the art can adapt the embodiment of FIG. 9 to partition memory array 310 into a differing number of partitions. For example, if memory array 310 is to be divided into eight partitions, multiplexers 910[N−4] and multiplexer 910[N−5] are deleted, the input terminal of inverter 930 is coupled to address line A[N−2], and the output terminal of inverter 930 is coupled to the second input terminal of multiplexer 910[N−3]. Conversely, if memory array 310 is to be divided into 64 partitions, the second input terminal of multiplexer 910[N−5] is coupled to address line A[N−6], the input terminal of inverter 930 is coupled to address line A[N−5], and a multiplexer 910[N−6] is added to drive internal address line I_A[N−6]. The first, second, third, and fourth input terminals of multiplexer 910[N−6] are coupled to address lines A[N−6] the output terminal of inverter 930, logic 0, and logic 1, respectively.

As explained above, silicon area is a major factor in the cost of a memory circuit. Thus, in many embodiments of address mapping circuit 340, rather than using a four input multiplexer, a three input multiplexer is substituted for each multiplexer in FIGS. 6 and 9. Table 5 is the truth table for the multiplexers of FIGS. 6 and 9, where G is an integer between N−1 and N−2, inclusive, for FIG. 6 and where G is an integer between N−1 and N−5, inclusive, for FIG. 9.

TABLE 5

| S [G] [1] | S [G] [0] | Output |
|---|---|---|
| 0 | 0 | First Input Terminal |
| 0 | 1 | Second Input Terminal |
| 1 | 0 | 0 |
| 1 | 1 | 1 |

As shown in Table 5, if S[G] [1] is equal to 1, then the output terminal of the multiplexer is driven to the same logic level as S[G] [0]. Therefore, a three input multiplexer having S[G] [0] coupled to the third input terminal would have the same truth table as Table 5. Thus, to conserve silicon area, many embodiments of address mapping circuit 340 use three input multiplexers with select line S[G] [0] coupled to the third input terminal of the three input multiplexers. Furthermore, many embodiments of address mapping circuit 340 use multiplexers constructed using pass transistors to further reduce the space required by a multiplexer as compared to an AND/OR logic gate implementation of multiplexers.

In the various embodiments of this invention, methods and structures have been described to reconfigure a memory circuit having a memory array to use only the functional partitions of the memory array. Thus, a memory circuit in accordance with the present invention does not require redundant memory cells to salvage a memory array having non-functional memory cells. Because redundant memory cells are not necessary, a memory circuit in accordance with the present invention is less expensive to produce than conventional memory circuits.

The various embodiments of the structures and methods of this invention that are described above are illustrative only of the principles of this invention and are not intended to limit the scope of the invention to the particular embodiments described. For example, in view of this disclosure, those skilled in the art can define other memory circuits, address mapping circuits, multiplexers, memory arrays, address mapping schemes, map selector circuits, and so forth, and use these alternative features to create a method, circuit, or system according to the principles of this invention. Thus, the invention is limited only by the following claims.

What is claimed is:

1. A memory circuit having an address bus and a data bus, the memory circuit comprising:

a memory array;

an address decoder coupled to the memory array;

a data tranceiver coupled to the memory array and the data bus; and an address mapping circuit coupled to the address bus and coupled to the address decoder by an internal address bus, wherein the memory address mapping circuit comprises:

a first multiplexer having a first select terminal, a second select terminal, a first input terminal coupled to a first address line of the address bus and an output terminal coupled to a first internal address line of the internal address bus; and a second multiplexer having a first select terminal, a second select terminal, a first input terminal coupled to a second address line of the address bus, a second input terminal coupled to the first address line of the address bus, and an output terminal coupled to a second internal address line of the internal address bus.

2. The memory circuit of claim 1, wherein the memory array comprises a plurality of partitions; and wherein the address mapping circuit includes configuration circuitry for remapping a first address directed to a non-functional partition into a second addresses directed to a functional partition.

3. The memory circuit of claim 1, wherein wherein the memory array comprises a plurality of partitions;

wherein the address mapping circuit includes configuration circuitry for selecting a subset of functional partitions from the plurality of partitions; and wherein the address mapping circuit remaps addresses from the address bus so that only partitions from the subset of functional partitions are enabled.

4. The memory circuit of claim 1, wherein the address mapping circuit further comprises an inverter having an input terminal coupled to the second address line of the address bus, and an output terminal coupled to a second input terminal of the first multiplexer.

5. The memory circuit of claim 1, wherein the address mapping circuit further comprises a map selector circuit coupled to the first select terminal of the first multiplexer, the second select terminal of the first multiplexer, the first select terminal of the second multiplexer, and the second select terminal of the second multiplexer.

6. The memory circuit of claim 1, wherein the select terminal of the first multiplexer is coupled to a third input terminal of the first multiplexer.

7. The memory circuit of claim 1, wherein the first multiplexer further comprises a third input terminal coupled to a logic low source and a fourth input terminal coupled to a logic high source.

8. The memory circuit of claim 1, wherein the address mapping circuit further comprises a third multiplexer having a first input terminal coupled to a third address line of the address bus, a second input terminal coupled to the second address line of the address bus, and an output terminal coupled to a third internal address line of the internal address bus.

9. The memory circuit of claim 1, wherein the address mapping circuit further comprises an inverter having an input terminal coupled to the first address line of the address bus, and an output terminal coupled to a second input terminal of the first multiplexer.

10. The memory circuit of claim 3, wherein the subset of functional partitions makes up half of the memory array.

11. The memory circuit of claim 3, wherein the memory array comprises 32 partitions.

12. The memory circuit of claim 5, wherein the map selector circuit comprises non-volatile memory cells.

13. The memory circuit of claim 8, wherein the address mapping circuit further comprises a fourth multiplexer having a first input terminal coupled to a fourth address line of the address bus, a second input terminal coupled to the third address line of the address bus, and an output terminal coupled to a fourth internal address line of the internal address bus.

14. The memory circuit of claim 8, wherein the address mapping circuit further comprises a fifth multiplexer having a first input terminal coupled to a fifth address line of the address bus, a second input terminal coupled to the fourth address line of the address bus, and an output terminal coupled to a fifth internal address line of the internal address bus.

* * * * *